United States Patent [19]
Harada et al.

[11] Patent Number: 5,642,049
[45] Date of Patent: Jun. 24, 1997

[54] MAGNETIC FIELD PRODUCING APPARATUS AND MANUFACTURING METHOD

[75] Inventors: Akihiro Harada; Naoji Yoshida; Yasuyuki Tahara; Kazuki Moritsu, all of Tokyo, Japan

[73] Assignee: Mitsubishi Denki Kabushiki Kaisha, Tokyo, Japan

[21] Appl. No.: 603,073

[22] Filed: Feb. 20, 1996

[30] Foreign Application Priority Data

Aug. 4, 1995 [JP] Japan ..................... 7-199634

[51] Int. Cl.$^6$ ..................................... G01V 3/00
[52] U.S. Cl. ................................. 324/318; 29/835
[58] Field of Search ..................... 324/318, 319, 324/320, 321, 322; 335/296; 29/835, 836, 847

[56] References Cited

U.S. PATENT DOCUMENTS

| | | | |
|---|---|---|---|
| 5,296,810 | 3/1994 | Morich | 324/318 |
| 5,349,318 | 9/1994 | Ihoue | 324/318 |
| 5,424,643 | 6/1995 | Morich et al. | 324/318 |

FOREIGN PATENT DOCUMENTS

| | | | |
|---|---|---|---|
| 58-170812 | 11/1983 | Japan | H01F 15/00 |
| 4337614 | 11/1992 | Japan | H01F 41/04 |
| 576507 | 3/1993 | Japan | A61B 5/055 |

Primary Examiner—Louis M. Arana
Attorney, Agent, or Firm—Sughrue, Mion, Zinn, Macpeak & Seas

[57] ABSTRACT

A magnetic field producing apparatus is obtained which can easily perform a connection work, while securing a connection work space of a vortex coil, and can omit a base member. A width of a groove at an inner peripheral turned portion of a vortex coil is made wide to form a space without positionally shifting a center of the respective turned portions of the vortex coil. An inner peripheral end of the vortex coil can be easily picked up, a junction work with a connection lead can be readily performed, and also a bending work can be properly achieved.

17 Claims, 6 Drawing Sheets

MAGNETIC FIELD PRODUCING APPARATUS AND MANUFACTURING METHOD

BACKGROUND OF THE INVENTION

The present invention relates to a magnetic producing apparatus for producing a gradient field required in, for instance, a nuclear magnetic resonance tomographic imaging apparatus and the like. More specifically, the present invention is directed to a vortex coil structure and a method for manufacturing the same.

A gradient magnetic field producing apparatus is constructed of three sorts of coils (Gx coil, Gy coil, Gz coil) for producing gradient magnetic fields along three directions (x axis, y axis, z axis) mutually perpendicular to each other. Furthermore, each of these coils along the respective directions includes an inner coil and an outer coil surrounding the inner coil capable of producing a desired gradient magnetic field as well as preventing magnetic leakage outside the gradient magnetic field producing apparatus by supplying a current to the outer coil in a direction opposite to that of the inner coil. In other words, this apparatus is a so-called active shield type gradient magnetic field producing apparatus.

FIG. 6 is a sectional view for showing such a sort of gradient magnetic field producing apparatus for the nuclear magnetic resonance tomographic apparatus, defined in a plane by the y axis and the z axis.

In this drawing, reference numeral 1 indicates a z-axial line, reference numeral 2 denotes an y-axial line, reference numeral 4 shows a Gy inner coil, and reference numeral 5 is a Gy outer coil. Reference numeral 17 shows an inner coil winding former, reference numeral 18 represents an outer coil winding former, reference numeral 19 indicates a Gx inner coil, reference numeral 20 denotes a Gx outer coil, reference numeral 21 represents a Gz inner coil, reference numeral 22 is a Gz outer coil, and reference numeral 23 indicates a fixing bolt for fixing the inner coil winding former 17 with the outer coil winding former 18. Also, reference numeral 10 shows a base member of coils (as will be discussed later).

FIG. 7 is a sectional view for showing only the Gy coil, for the sake of simplicity, defined in a plane by the x axis and the y axis. In this drawing, reference numeral 3 shows an x-axial line.

FIG. 8 is a perspective view of the Gy coils along the inclined direction. The Gy inner coil 4 is constructed of four vortex coils having the same shape, a detailed structure of which will be discussed. These four coils are arranged in a symmetrical manner with respect to the z-axial line 1, the y-axial line 2, and the x-axial line 3, and are connected in series to each other by employing connection leads (as will be explained later). Similarly, the Gy outer coil 5 is constructed of four vortex coils having the same shape. It should be understood that the vortex shapes of the Gy inner coil 4 are different from those of the Gy outer coil 5.

It should also be noted that the Gx coil is arranged in such a manner that the Gx coil is shifted by 90 degrees along the circumferential direction, and is similarly constructed by vortex coils similar to those of the Gy coil.

The Gz coil is different from the vortex coil, and can be, for example, a solenoid-shaped coil made of a plain rectangular copper wire wound on a cylindrical surface.

FIG. 9 illustrates one sheet of a vortex coil 8 used in the Gy coil. The vortex coil 8 is manufactured in such a manner that, for instance, a groove 9 having a width of approximately 1.5 mm is fabricated in a vortex form in a copper having a thickness of approximately 1 mm to 3 mm, corresponding to a conductive plate, thereby forming plural turns of coil, and further these coil turns are bent in a saddle shape on a cylindrical former. Various working (processing) methods such as machine cutting, etching, and water jetting may be introduced to form the groove 9 in the copper plate.

A description will now be made of forming the Gy inner coil 4 and the like by connecting this single body of the vortex coil 8. FIG. 10 represents the vortex coil 8 immediately after the groove has been made. As illustrated in this drawing, the vortex coil 8 adheres to a base member 10 made of an epoxy plate and the like. It should be noted that a portion of the copper plate is hatched.

This base member 10 is used to correctly bend the copper plate formed in the vortex shape, in which the groove 9 is formed. As indicated in FIG. 10, the widths of the respective turns of the vortex coil 8 are not made constant, and the copper plate is packed up to a terminal portion 16 of an inner peripheral portion. A trace or orbit of the groove 9 is determined base on the magnetic design.

FIG. 11 shows a connection construction of the Gy coil. FIG. 11A is a perspective view for indicating an overall shape of the Gy coil arranged by four sheets of the vortex coil 8, and FIG. 11B is a plan view for showing two sheets of the vortex coil 8 among them. In the drawing, reference numeral 15 is a connection lead for connecting end portions 16 of the two vortex coils 8 with each other. Since the coil connection by way of soldering does not achieve sufficient strength, brazing is generally employed. Although not shown in the drawings, the connection lead along the y-axial line 2 is connected to the outermost coil turn, and then four sheets of vortex coil 8 are mutually connected series to each other, so that the Gy inner coil 4 and the Gy outer coil 5 are formed.

Since the conventional gradient magnetic field producing apparatus has been arranged as described above, there are various problems mainly caused by the specific conditions of the manufacturing stages. One problem is that when the connection lead 15 is jointed to the vortex coil 8 by way of brazing, since the copper plate is packed up to the terminal (end) portion 16 of the inner peripheral portion of the vortex coil 8, it is difficult to pick up the terminal portion 16 This, there may be insufficient work space to secure a brazing head portion on the connection portion.

Also when the vortex coil 8 of the copper plate is bent, since the inner peripheral terminal portion 16 is highly rigid the terminal portion 16 cannot be smoothly fitted on the curved surface. Therefore, there is another problem that the inner peripheral terminal portion 16 may rise from the curved surface.

Moreover, when the vortex coil 8 of the copper plate is bent, the base member 10 must be employed to mechanically reinforce the copper plate by adhering to the copper plate so as not to positionally shift these coil turns. Then, when the gradient magnetic field producing apparatus is of a so-called "active shield type", due to the presence of the reinforcing base, a difference between the diameter of the inner coil and the diameter of the outer coil would is less than it would be in the absence of the reinforcing base.

As previously explained, since the inner coil and the outer coil are employed so as to produce the magnetic fields directed oppositely inside and outside the apparatus, there is a difficulty that a higher magnetomotive force is required, as compared to the inner coil only, in order to produce a desired magnetic field as the gradient magnetic field producing apparatus. That is, assuming now that both of the maximum inner diameter of the inner/outer coil assembly and the minimum outer diameter thereof are limited to constant values thereof, each other, the dimension between the inner coil and the outer coil is reduced, so that the required magnetomotive force would be increased.

In other words, this sort of active shield type gradient magnetic field producing apparatus must be designed in accordance with the following basis. That is, the inner coil must be mounted, while being separated from the outer coil as far as possible within the allowable space of this field producing apparatus, so that the field producing efficiency is increased and the overall required magnetomotive force is reduced. When the magnetomotive force is lowered, since the rated current and the rated voltage of this apparatus are lowered, the power source capacity may be reduced, so that the vibrations, noise and heat generation of this gradient magnetic field producing apparatus could be reduced. As a consequence, the employment of such a base member 10 would impede the small-sizing in case of this type of gradient magnetic field producing apparatus.

SUMMARY OF THE INVENTION

The present invention has been made to solve the above-described problems, and therefore, has an object to obtain a magnetic field producing apparatus capable of assuring a work space used to connect vortex coils with each other and of readily bending these vortex coils without employing a base member.

A magnetic field producing apparatus according to aspect 1 is characterized in that a width of the groove at an inner peripheral turned portion of the vortex coil is made wide without positionally shifting a center of the respective turns of the vortex coil, so that a width of a conductive member at the inner peripheral turned portion of the vortex coil is reduced.

A magnetic field producing apparatus according to aspect 2 is characterized in that a portion of a conductive member of the vortex coil at an inner peripheral end except for a joint portion with the connection lead is deleted without positionally shifting a center of the respective turns of the vortex coil.

A magnetic field producing apparatus according to aspect 3 is characterized in that an adhesive agent made of an insulating material is filled within the groove.

A method for manufacturing a magnetic field producing apparatus according to aspect 4 is comprised of the steps of:
forming a groove in a plane-shaped conductive plate, while very small bridging portions (will be referred to "microjoints" hereinafter) are left in a predetermined interval; bending the conductive plate in a shape of a cylindrical surface; and cutting away the microjoints thereafter.

A method for manufacturing a magnetic field producing apparatus according to aspect 5 is comprised of: forming a groove in a plane-shaped conductive plate; filling an adhesive agent into the groove to be hardened; and bending the conductive plate in a shape of a cylindrical surface thereafter.

A method for manufacturing a magnetic field producing apparatus according to aspect 6 is comprised of: forming a groove in a plane-shaped conductive plate, while microjoints are left at a predetermined interval; filling an adhesive agent into the groove to be harden; cutting away the microjoints thereafter; and finally bending the conductive plate in a shape of a cylindrical surface.

A method for manufacturing a magnetic field producing apparatus according to aspect 7 is characterized in that the microjoints are made by forming a hole at a center of the bridging portion along a longitudinal direction of the groove; and the microjoints are cut away in such a manner that a tip portion of a cutter is inserted into the hole.

DETAILED DESCRIPTION OF THE PREFERRED EMBODIMENTS (EMBODIMENT 1)

Figure 1:
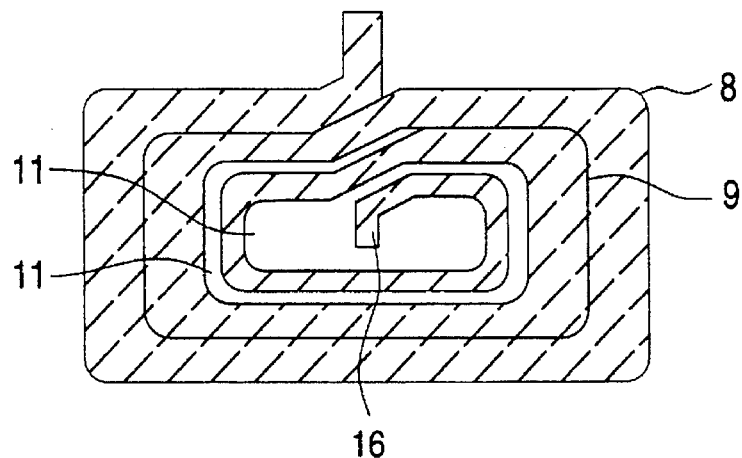
FIG. 1 is a plan view for indicating a vortex coil 8 of a gradient magnetic field producing apparatus according to embodiment 1 of the present invention.

FIG. 1 is a plan view for showing a vortex coil 8 of a gradient magnetic field producing apparatus according to embodiment 1 of the present invention. To process a copper plate to obtain the vortex coil 8, a groove 9 is fabricated by employing various methods such as machine cutting, etching, and water jetting. At this time, a conductive member portion of the vortex coil 8 is deleted to form a space 11 in such a manner that a width of the groove at inner peripheral turned portions of the vortex coil 8, normally two to three turned portions (note that only 1 turned portion is shown in FIG. 1 for the sake of simplicity) is made larger (wider) than that of other portion.

It is of course required to determine the shape of this space 11 based upon the analysis on the magnetic field calculation in order that a center of the respective turned portions are not positionally shifted due to the provision of this space 11.

Figure 11A:
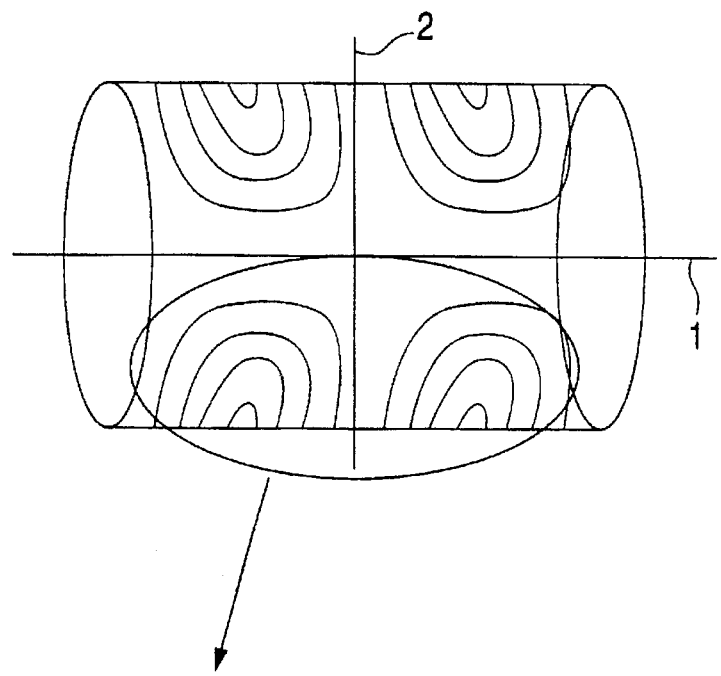
FIGS. 11A and 11B are a perspective view and a plan view, for showing a connection structure of a Gy coil.
Figure 11B:
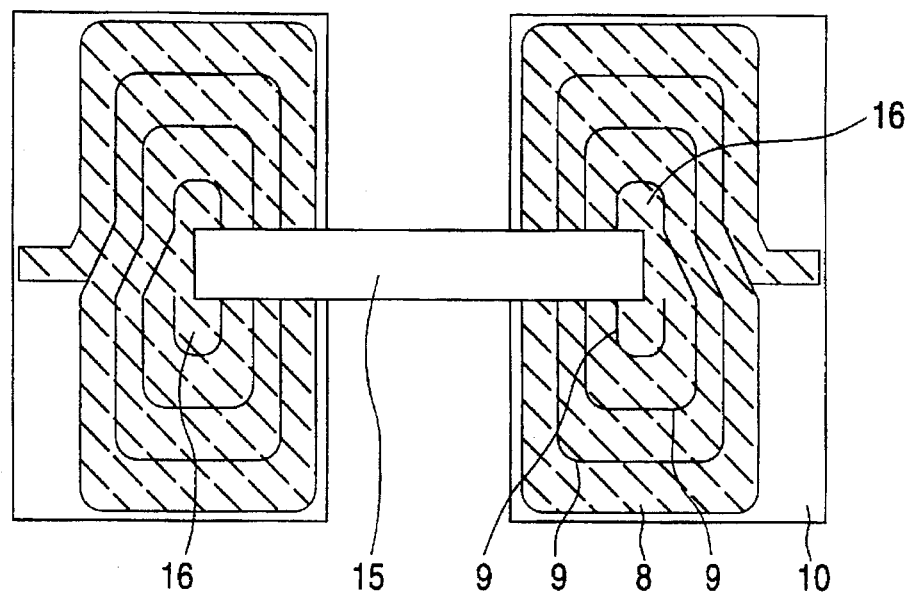

In this embodiment, when a central portion of the vortex coil 8 can have flexibility and a connection lead 15 (like that shown in FIG. 11B) is jointed to the vortex coil 8, an inner peripheral terminal portion 16 is easily picked up, so that a work space used to perform a bonding work can be secured. Also, when the vortex coil 8 is bent, the central portion is not floated but a saddle-shaped vortex coil 8 can be made in accordance with a preselected curved surface. Accordingly, such a gradient magnetic field producing apparatus with high precision can be manufactured.

(EMBODIMENT 2)

Figure 2:
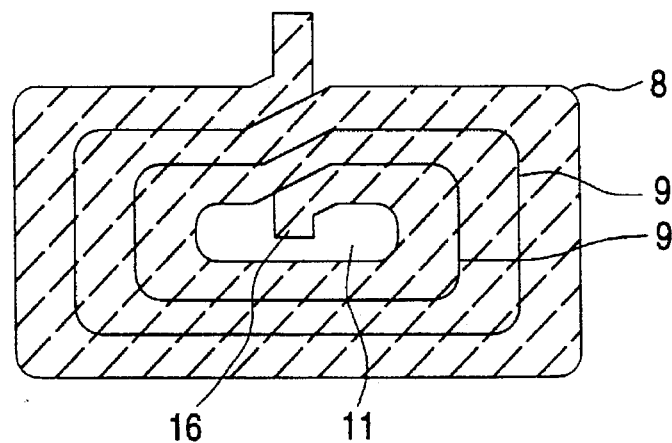
FIG. 2 is a plan view for showing a vortex coil 8 according to embodiment 2 of the present invention.

FIG. 2 is a plan view for indicating a vortex coil 8 manufactured in accordance with embodiment 2 of the present invention. In this embodiment, a space 11 is formed by deleting a portion of a conductive member at an inner peripheral end except for a joint portion (terminal portion 16) with a connection lead 15 (like that shown in FIG. 11B).

Similar to embodiment 1, a center portion of the vortex coil 8 can have flexibility, so that a joint work between this vortex coil 8 and the connection lead 15 can be easily performed and also precision in the bending work can be improved.

(EMBODIMENT 3)

Figure 3:
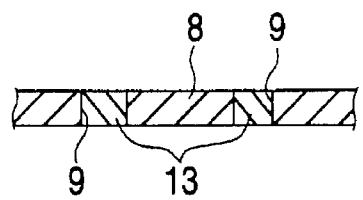
FIG. 3 is a sectional view for representing a portion of a vortex coil 8 according to embodiment 3 of the present invention.

FIG. 3 is a sectional view for indicating a portion of a vortex coil 8 manufactured according to embodiment 3 of the present invention. In this drawing, reference numeral 13 denotes an adhesive agent made of an insulating material such as an epoxy resin. As described above, since the adhesive agent 13 is filled into the groove to be hardened, the respective turned portions of the vortex coil 8 are mechanically made in one body, so that no unnecessary deformation is caused by the bending work and the like, and then the mechanical reliability of the resultant magnetic field producing apparatus can be improved. It should be understood that the adhesive agent 13 may be filled into the groove 9 by using a brush and an air spray.

Further, as the strength of the vortex coil 8 itself is increased by employing this adhesive agent 13, the base member 10 can be omitted. As a consequence, a total cost may be reduced. In addition, since there is no space occupied by the base member, the inner coil can be separated from the outer coil by a dimension defined by a thickness of this space, as compared with the conventional structure. The required magnetomotive force of the coil can be reduced, and the rated current can be lowered. As a result, the power supply can be made with a low capacity. Vibrations, noise, and heat generation produced from the magnetic field producing apparatus can be reduced.

(EMBODIMENT 4)

Figure 4A:
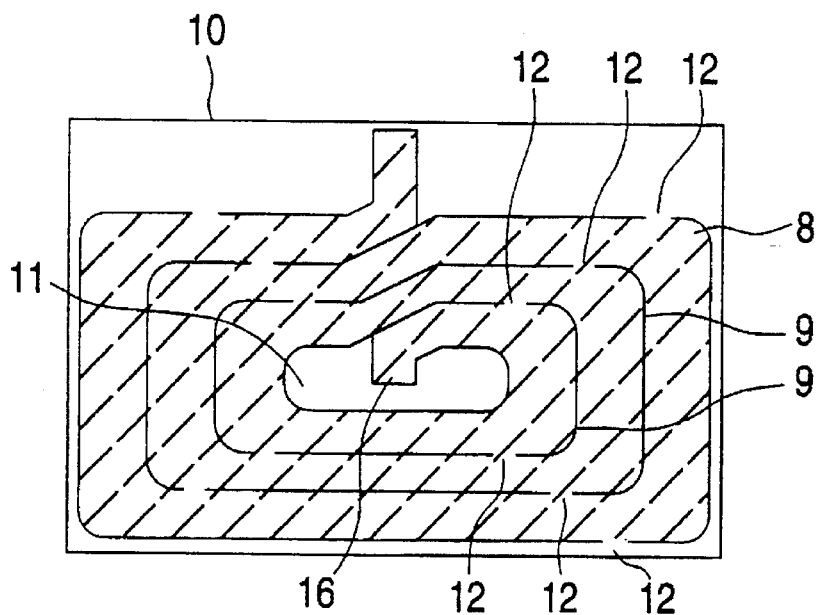
FIGS. 4A and 4B are a plan view for indicating a vortex coil 8 according to embodiment 4 of the present invention, and an enlarge view for showing an enlarged portion of this vortex coil.
Figure 4B:
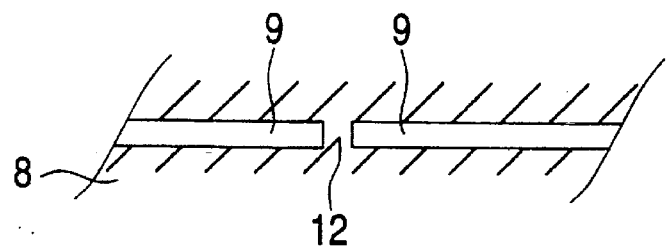

FIG. 4 represents a vortex coil 8 manufactured in accordance with embodiment 4 of the present invention. FIG. 4A is a plan view for showing an overall arrangement of the vortex coil 8, and FIG. 4B is an enlarged view for partially enlarging the vortex coil 8. As previously explained, the vortex coil 8 is manufactured by forming a groove 9 in a vortex shape in a copper plate. In accordance with this embodiment mode 4, when this groove 9 is fabricated, microjoints 12 corresponding to very small bridging portions are left in a predetermined interval. This is because the microjoints 12 prevent the deformation of the conductive member, which is processed by way of, for instance, the water jetting process. The length of this microjoint 12 may be properly selected to be on the order of 2 mm in view of strengths and cutting process (as will be discussed later).

The bending work is carried out under such a condition that the microjoints 12 are left. Thereafter, the microjoints 12 are cut away by using a hand drill or a nipper. Since the turned portions of the vortex coil 8 are bridged by the microjoints 12 to be formed in one body, the proper bending work can be realized.

Although not shown in the drawings, after the groove 9 has been formed under such a condition that the microjoints 12 are left, an adhesive agent may be filled into this groove 9 so as to harden the adhesive agent, and the microjoints 12 may be cut away. Subsequently, the bending work may be carried out for the resultant vortex coil. Alternatively, it is also possible to cut away the microjoints 12 after the bending work has been performed.

In any case, the reinforcement effects between the microjoints and the adhesive agent can be mutually achieved, so that more highly reliable vortex coils can be manufactured with high precision.

As another method utilizing the microjoints 12, the plate-like vortex coil 8 is once attached to the base member 10 in a similar manner to the prior art and then bent. Thereafter, only this base member is taken out and the microjoints 12 are finally cut away. In this case, the microjoints 12 may have two functions. That is, the microjoints can reinforce the vortex coil when this coil is attached to the base member and this base member is removed from the coil.

(EMBODIMENT 5)

Figure 5:
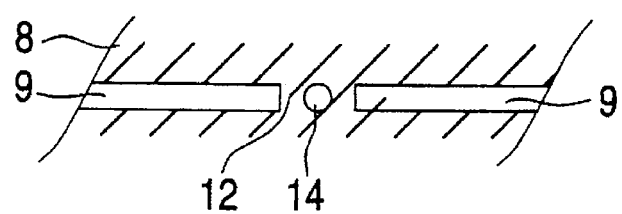
FIG. 5 is an enlarge view for showing an enlarged portion of a vortex coil 8 according to embodiment 5 of the present invention.
Figure 6:
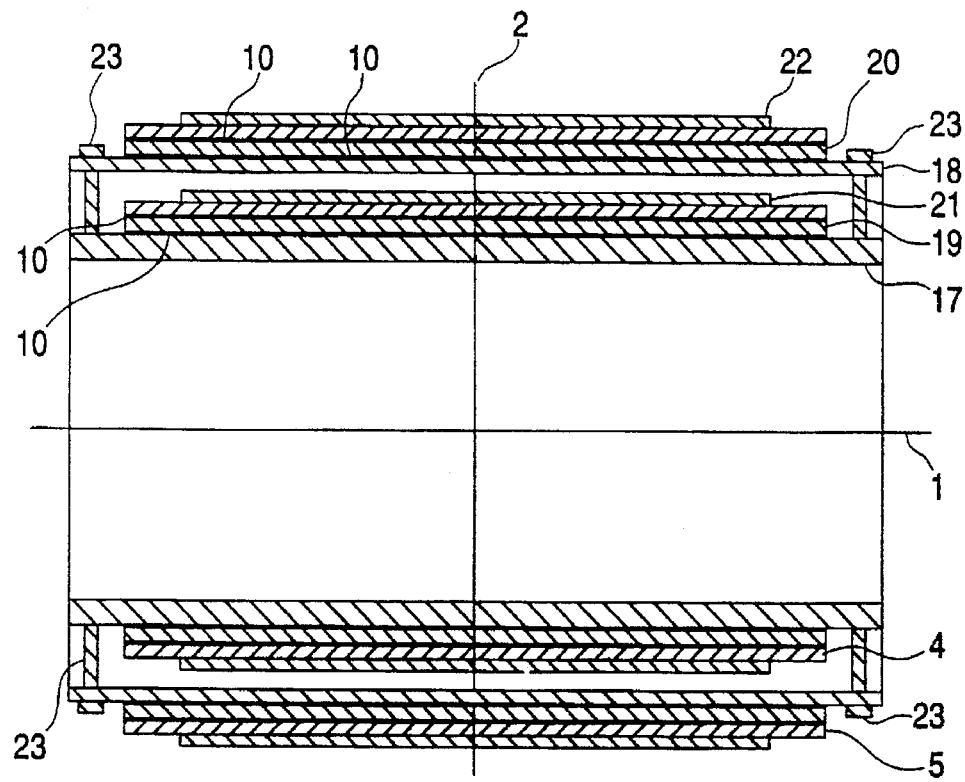
FIG. 6 is a sectional view for indicating the prior art gradient magnetic field producing apparatus.
Figure 7:
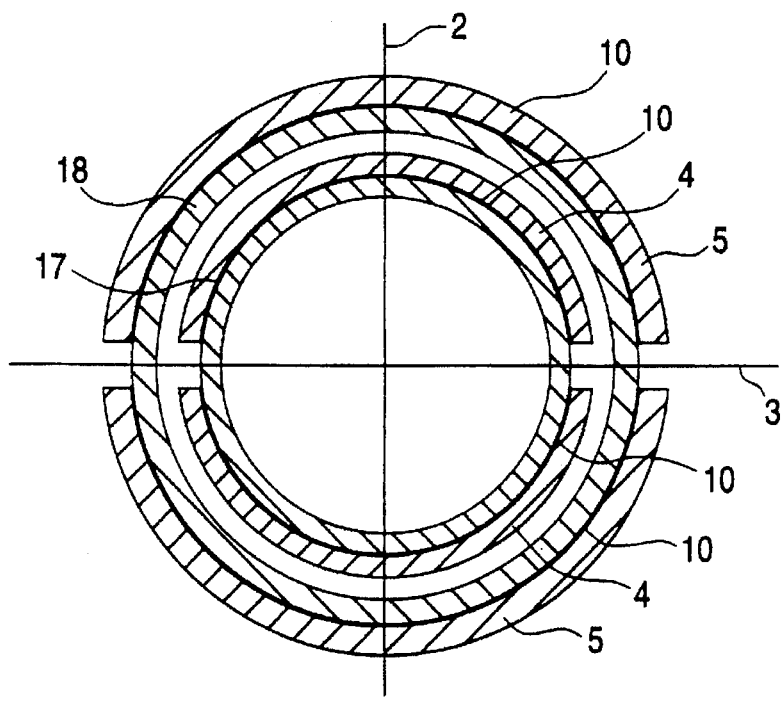
FIG. 7 is a sectional view for representing the prior art gradient magnetic field producing apparatus, as shown by another sectional view different from that of FIG. 6.
Figure 8:
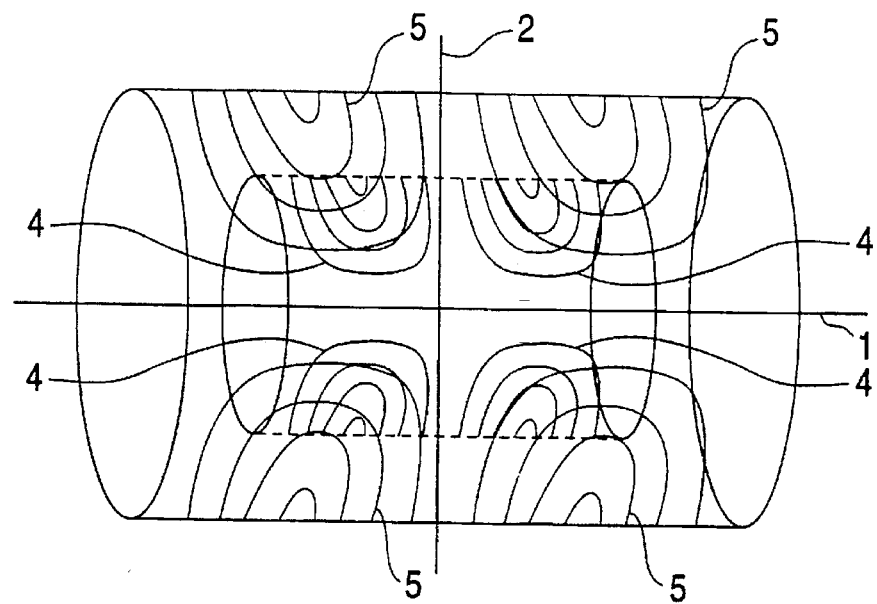
FIG. 8 is a perspective view of a Gy coil.
Figure 9:
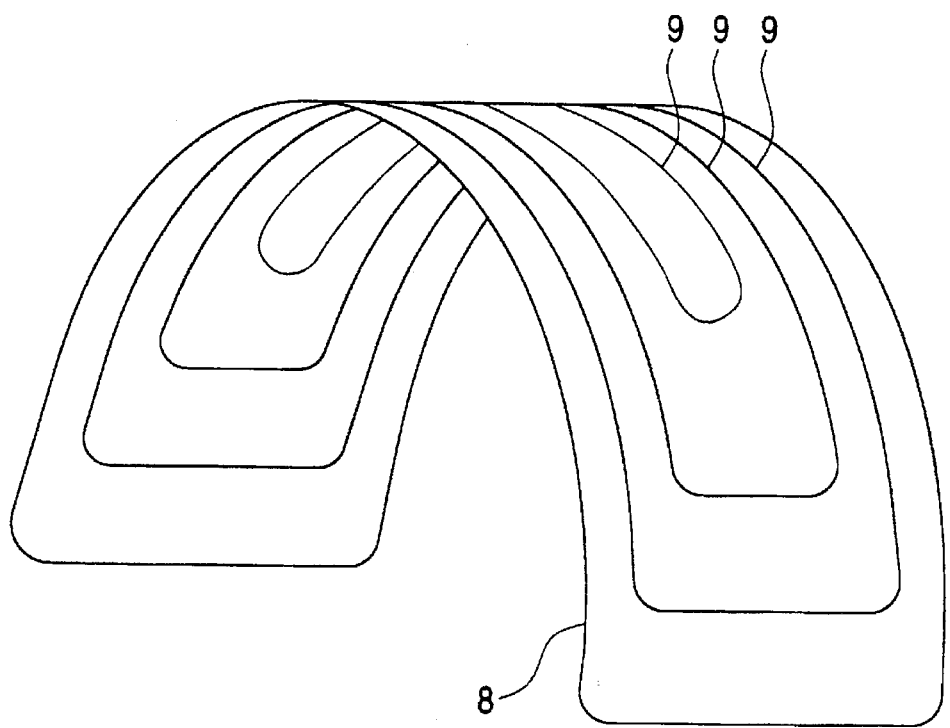
FIG. 9 is a perspective view for indicating one sheet of the vortex coil 8.
Figure 10A:
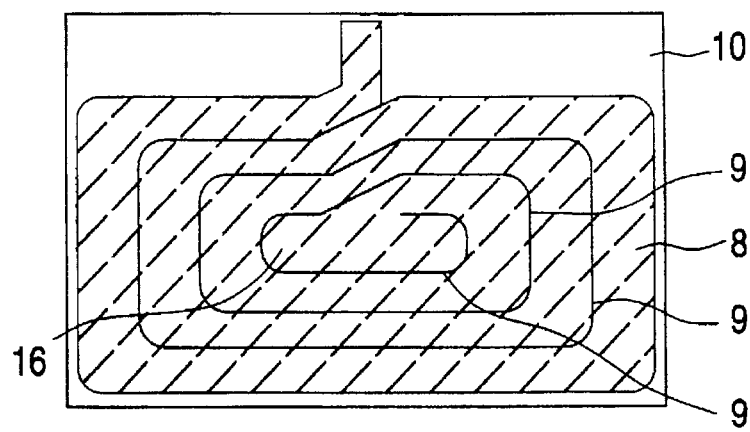
FIGS. 10A and 10B are a plan view and a side view, for indicating the prior art vortex coil 8.
Figure 10B:
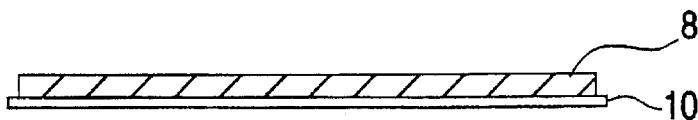

FIG. 5 is a plane view for partially enlarging a vortex coil 8 manufactured in accordance with embodiment mode of the present invention. Embodiment differs from embodiment 4 in that a drill hole 14 is formed in a center of a bridge portion of a microjoint 12. By doing so, when the microjoints 12 are taken away by using a nipper and a hand drill after they are hardened by an adhesive agent, a tip portion of a cutter may abut against the drill hole 14. As a consequence, even after the vortex coil has been bent, the microjoints may be simply removed. Since other application method and effects of this embodiment mode 5 are completely identical to those of the embodiment mode 4, explanations thereof are omitted.

(EMBODIMENT 6)

It should be noted that the respective modes of the above-described embodiments have described that the present invention has been applied to the active shield type gradient magnetic field producing apparatus. However, the present invention is not limited to the above case, but may be widely applied to a magnetic field producing apparatus equipped with a vortex coil and a connection lead jointed to this vortex coil, resulting in a similar effect.

As previously described, in accordance with the present invention as recited in aspect 1, since the width of the groove at the inner peripheral turned portion of the vortex coil is made wide so as to reduce the width of the conductive member located at this turned portion, the inner peripheral end of the vortex coil can be easily picked up, so that the easy jointing work with the connection lead can be achieved and the bending work can be properly performed.

Also, according to the present invention as recited in aspect 1, since the inner peripheral end of the vortex coil except for the joint portion with the connection lead of the conductive member is deleted, the inner peripheral end of the vortex coil can be readily picked up. Accordingly, the easy jointing work with the connection lead can be achieved and the bending work can be properly performed.

In accordance with the present invention as recited in aspect 3, as the adhesive agent is filled into the groove to reinforce the vortex coil in an integral body, the base member which is required in the prior art is no longer needed.

Also, in the present invention related to aspect 4, since the microjoints are left during the groove forming stage and the bending work stage, the microjoints may reinforce the vortex coil. Thus, the base member which is conventionally required is no longer needed.

In accordance with the present invention as recited in aspect 5, after the adhesive agent has been filled into the groove to harden the groove, the resultant vortex coil is bent, so that a proper bending work can be achieved without employment of the base member.

Also, in accordance with the present invention as recited in aspect 6, since the adhesive agent is filled into the groove to be hardened under such a condition that the microjoint are left, the vortex coil can be reinforced under proper conditions by way of the adhesive agent to be formed in an integral body.

Also, in accordance with the present invention as recited in aspect 7, since the microjoints are made by forming the hole at the center of the bridging portion thereof along the longitudinal direction of the groove, the cutting work of the microjoints can be easily realized by using this hole.

What is claimed is:

1. A magnetic field producing apparatus, comprising:
   a saddle-shaped conductive plate arranged on a cylindrical surface;
   a vortex coil having plural turns arranged by forming a groove in a vortex shape on said saddle-shaped conductive plate; and
   a connection lead whose one end is jointed to an inner peripheral end of said vortex coil, for producing a desired magnetic field within a space surrounded by said cylindrical surface by energizing said vortex coil, wherein
   a width of said groove at an inner portion of said vortex coil is wider than a width of said groove at an outer portion of said vortex coil, so that a width of inner turns of said vortex coil is less than a width of outer turns of said vortex coil.

2. A magnetic field producing apparatus of claim 1, wherein said vortex coils with plural turns is made of a copper having a thickness of approximately 1 mm to 3 mm.

3. A method for manufacturing a magnetic field producing apparatus, comprising the steps of:
   forming a vortex-shaped groove in a plane-shaped conductive plate, said groove defining a vortex coil having plural turns, said groove being formed such that microjoints remain between adjacent turns of said vortex coil at predetermined intervals and such that a width of said groove at an inner portion of said vortex coil is wider than a width of said groove at an outer portion of said vortex coil, so that a width of inner turns of said vortex coil is less than a width of outer turns of said vortex coil;
   bending said conductive plate in a shape of a cylindrical surface; and
   cutting away said microjoints thereafter.

4. A method for manufacturing said magnetic field producing apparatus of claim 3 wherein:
   said microjoints are made by forming a hole at a center of said bridging portion along a longitudinal direction of said groove, and are cut away in such a manner that a tip portion of a cutter is inserted into said hole.

5. A method for manufacturing said magnetic field producing apparatus of claim 3, wherein the step of forming a groove is selected from the group of machine cutting, etching, and water jetting.

6. A magnetic field producing apparatus, comprising:
   a saddle-shaped conductive plate arranged on a cylindrical surface;
   a vortex coil having plural turns arranged by forming a groove in a vortex shape on said saddle-shaped conductive plate; and
   a connection lead whose one end is jointed to an inner peripheral end of said vortex coil, for producing a desired magnetic field within a space surrounded by said cylindrical surface by energizing said vortex coil;
   wherein said inner peripheral end of said vortex coil includes a joint portion which protrudes into a space formed at the center of said vortex coil by removing a portion of said saddle-shaped conductive plate.

7. A magnetic field producing apparatus of claim 6, wherein said vortex coils with plural turns is made of a copper having a thickness of approximately 1 mm to 3 mm.

8. A method for manufacturing a magnetic field producing apparatus, comprising the steps of:
   forming a vortex-shaped groove in a plane-shaped conductive plate, said groove defining a vortex coil having plural turns, said groove being formed such that microjoints remain between adjacent turns of said vortex coil at predetermined intervals and such that an inner peripheral end of said vortex coil includes a joint portion which protrudes into a space formed at the center of said vortex coil by removing a portion of said plane-shaped conductive plate;
   bending said conductive plate in a shape of a cylindrical surface; and
   cutting away said microjoints thereafter.

9. A method for manufacturing said magnetic field producing apparatus of claim 8 wherein:
   said microjoints are made by forming a hole at a center of said bridging portion along a longitudinal direction of said groove, and are cut away in such a manner that a tip portion of a cutter is inserted into said hole.

10. A method for manufacturing said magnetic field producing apparatus of claim 8, wherein the step of forming a groove is selected from the group of machine cutting, etching, and water jetting.

11. A magnetic field producing apparatus, comprising:
    a saddle-shaped conductive plate arranged on a cylindrical surface;
    a vortex coil with plural turns arranged by forming a groove in a vortex shape on said saddle-shaped conductive plate; and
    a connection lead whose one end is jointed to an inner peripheral end of said vortex coil, for producing a desired magnetic field within a space surrounded by said cylindrical surface by energizing said vortex coil, wherein
    said groove is filled with an adhesive agent made of an insulating material.

12. A magnetic field producing apparatus of claim 11, wherein said vortex coils with plural turns is made of a copper having a thickness of approximately 1 mm to 3 mm.

13. A method for manufacturing a magnetic field producing apparatus, comprising the steps of:
    forming a groove in a plane-shaped conductive plate, said groove defining a vortex coil having plural turns;
    filling an adhesive agent into said groove to be hardened; and
    bending said conductive plate in a shape of a cylindrical surface thereafter.

14. A method for manufacturing said magnetic field producing apparatus of claim 13, wherein the step of forming a groove is selected from the group of machine cutting, etching, and water jetting.

15. A method for manufacturing a magnetic field producing apparatus, comprising the steps of:
    forming a vortex-shaped groove in a plane-shaped conductive plate, said groove defining a vortex coil having plural turns, said groove being formed such that microjoints remain between adjacent turns of said vortex coil at predetermined intervals and;

filling an adhesive agent into said groove to be hardened;

cutting away said microjoints thereafter; and bending said conductive plate in a shape of a cylindrical surface.

16. A method for manufacturing said magnetic field producing apparatus of claim 15 wherein:

said microjoints are made by forming a hole at a center of said bridging portion along a longitudinal direction of said groove, and are cut away in such a manner that a tip portion of a cutter is inserted into said hole.

17. A method for manufacturing said magnetic field producing apparatus of claim 15, wherein the step of forming a groove is selected from the group of machine cutting, etching, and water jetting.

\* \* \* \* \*